(12) United States Patent
Mrakovich

(10) Patent No.: US 7,273,300 B2
(45) Date of Patent: Sep. 25, 2007

(54) CURVILINEAR LED LIGHT SOURCE

(75) Inventor: Matthew Mrakovich, Streetsboro, OH (US)

(73) Assignee: Lumination LLC, Valley View, OH (US)

( * ) Notice: Subject to any disclaimer, the term of this patent is extended or adjusted under 35 U.S.C. 154(b) by 0 days.

(21) Appl. No.: 10/913,717

(22) Filed: Aug. 6, 2004

(65) Prior Publication Data

US 2006/0028837 A1 Feb. 9, 2006

(51) Int. Cl.
*F21V 21/00* (2006.01)

(52) U.S. Cl. .................. 362/249; 362/235; 362/555; 362/558; 362/581

(58) Field of Classification Search .......... 362/551, 362/555, 558, 581, 235, 249, 311, 355
See application file for complete search history.

(56) References Cited

U.S. PATENT DOCUMENTS

| | | | |
|---|---|---|---|
| 5,982,969 A | 11/1999 | Sugiyama et al. | |
| 6,217,194 B1 * | 4/2001 | Huang | 362/249 |
| 6,361,186 B1 | 3/2002 | Slayden | |
| 6,497,496 B2 * | 12/2002 | Wang | 362/249 |
| 6,583,550 B2 * | 6/2003 | Iwasa et al. | 313/485 |
| 6,592,238 B2 | 7/2003 | Cleaver et al. | |
| 6,604,841 B2 | 8/2003 | Liu | |
| 6,609,813 B1 | 8/2003 | Showers et al. | |
| 6,673,292 B1 | 1/2004 | Gustafson et al. | |
| 6,673,293 B1 | 1/2004 | Mistopoulos et al. | |
| 6,682,205 B2 * | 1/2004 | Lin | 362/249 |
| 6,717,362 B1 * | 4/2004 | Lee et al. | 313/512 |
| 6,840,655 B2 * | 1/2005 | Shen | 362/249 |
| 7,011,421 B2 * | 3/2006 | Hulse et al. | 362/84 |

OTHER PUBLICATIONS

International Search Report; Date of Mailing Aug. 24, 2006, ISA/US, Authorized Officer Sandra O'Shea, 3 pages.

* cited by examiner

*Primary Examiner*—Renee Luebke
*Assistant Examiner*—Gunyoung T. Lee
(74) *Attorney, Agent, or Firm*—Fay Sharpe LLP

(57) ABSTRACT

An LED system that simulates bare or exposed neon in appearance. The curvilinear LED light source comprises a rigid, formable light guide having a generally circular cross-section and a flexible LED light engine. The light guide is made of a material or materials that can be heated and formed into a desired shape. The light guide retains the desired shape upon cooling. The flexible light engine is inserted into a groove in the light engine.

3 Claims, 3 Drawing Sheets

CURVILINEAR LED LIGHT SOURCE

BACKGROUND OF THE INVENTION

1. Field of the Invention

The present invention relates to illuminated signs and artwork, particularly the invention relates to LED illuminated signs and artwork that simulate neon signs.

2. Summary of Related Art

Currently, advertising and other signs are made of neon light bulbs, incandescent light bulb and/or fluorescent light bulbs. However, there are many drawbacks to these prior art solutions. Incandescent and fluorescent lights burn out easily. While neon lights have a long service life, neon lights have several significant drawbacks. Neon lights are not durable and impact resistant. The tubes can break or be damaged relatively easily, especially during shipping and handling. Neon lights are relatively difficult to install due to their high voltage requirements. Neon lights are not easy to service. An entire sign must be removed from the site, taken back to the shop where it is either repaired or replaced. Then the sign must be returned to and re-installed at the site. Neon signs contain mercury and rare gases that could poses environmental health and safety issues. Neon's high voltage requirements make compliance to strict regulatory requirements and national and local electrical codes a major concern for sign companies and their customers.

Neon signs are created by heating a glass tube into a pliable state and bending it into the desired shape. The bent tube is injected with neon or another inert gas such as argon or a mercury argon mix. Neon gives off a reddish orange color when it is excited and argon/mercury gives off a blue color when it is excited. To create additional colors, the inside of the glass tube is coated with fluorescent powders that absorb light in a given wavelength(s) and re-emit light in a different wavelength.

In the past, attempts have been made to use LEDs as a substitute for neon lights. However, prior art LED solutions have been found to be unsatisfactory. Prior LED solutions can not be easily formed and maintained into a desired shape by the sign companies. Custom shapes must be ordered from the factory for higher prices and require long lead-times. Prior LED solutions do not offer a wide viewing angle. A wide viewing angle, greater than 180°, is more similar to neon lights and is required for many applications. Prior art flexible LED solutions can not make and hold tight bends or require special clips or custom channels to maintain a desired shape. Further, prior art LED solutions are not generally the same size and shape as the neon tubes they are trying to replace.

SUMMARY OF THE INVENTION

The present invention is an LED system that simulates bare or exposed neon in appearance and performance. The system is comprised of a formable light guide and a flexible light engine. The light guide has a generally circular cross-section with a groove along its length. The light guide is made of a material or materials that can be heated and formed into a desired shape and retain the desired shape upon cooling without losing the original properties of the material. A flexible light engine is then inserted into and retained by the groove along the length of the formed light guide. Different colors are achieved by using different light engines with the same light guide, different LEDs, or different coatings.

The system produces a uniform lit appearance with a wide viewing angle and intensity similar to neon.

DETAILED DESCRIPTION OF THE INVENTION

Figure 1:
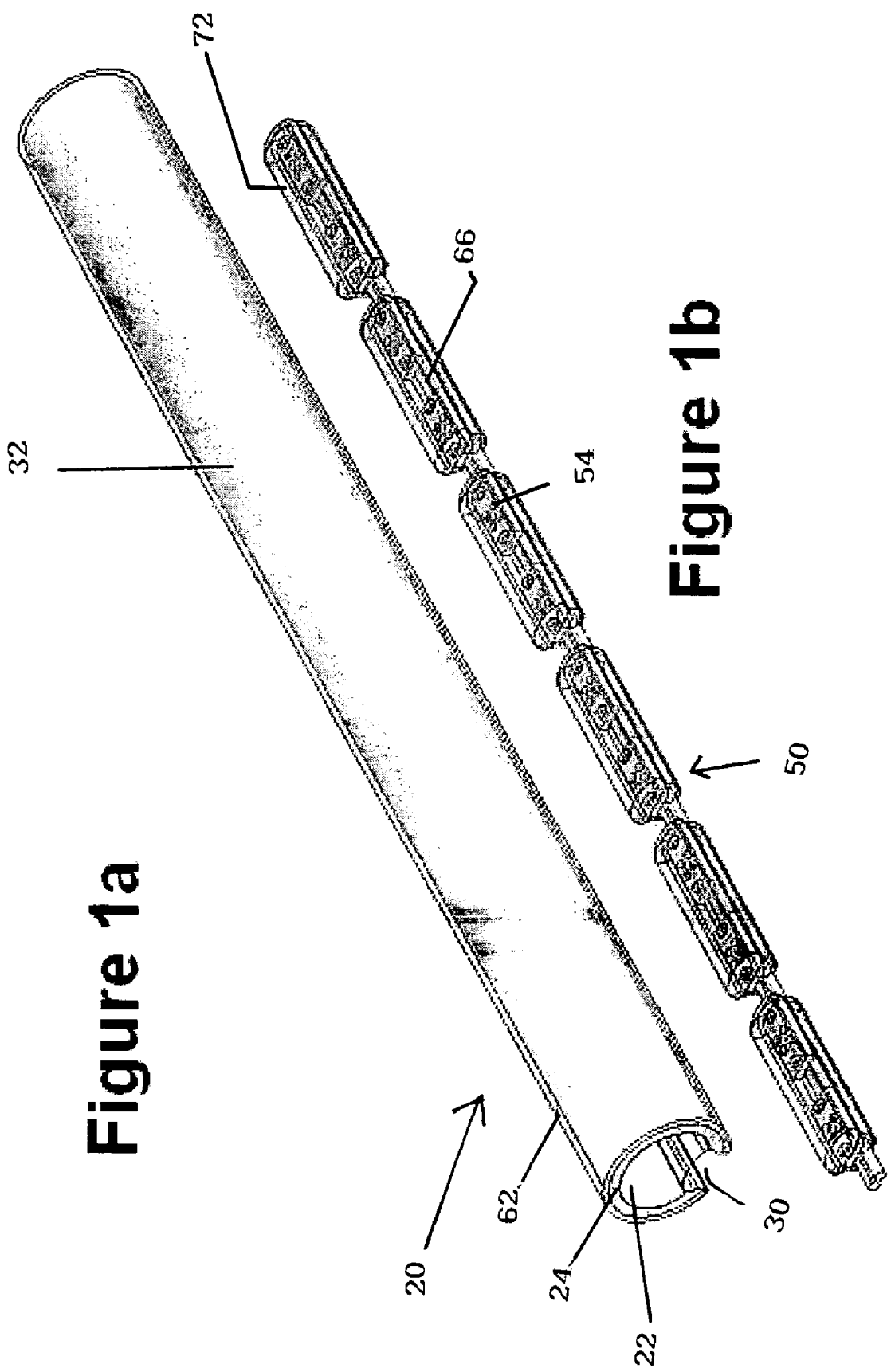
FIG. 1a is a perspective view of the light guide.
FIG. 1b is a perspective view of the LED light engine.
Figure 2:
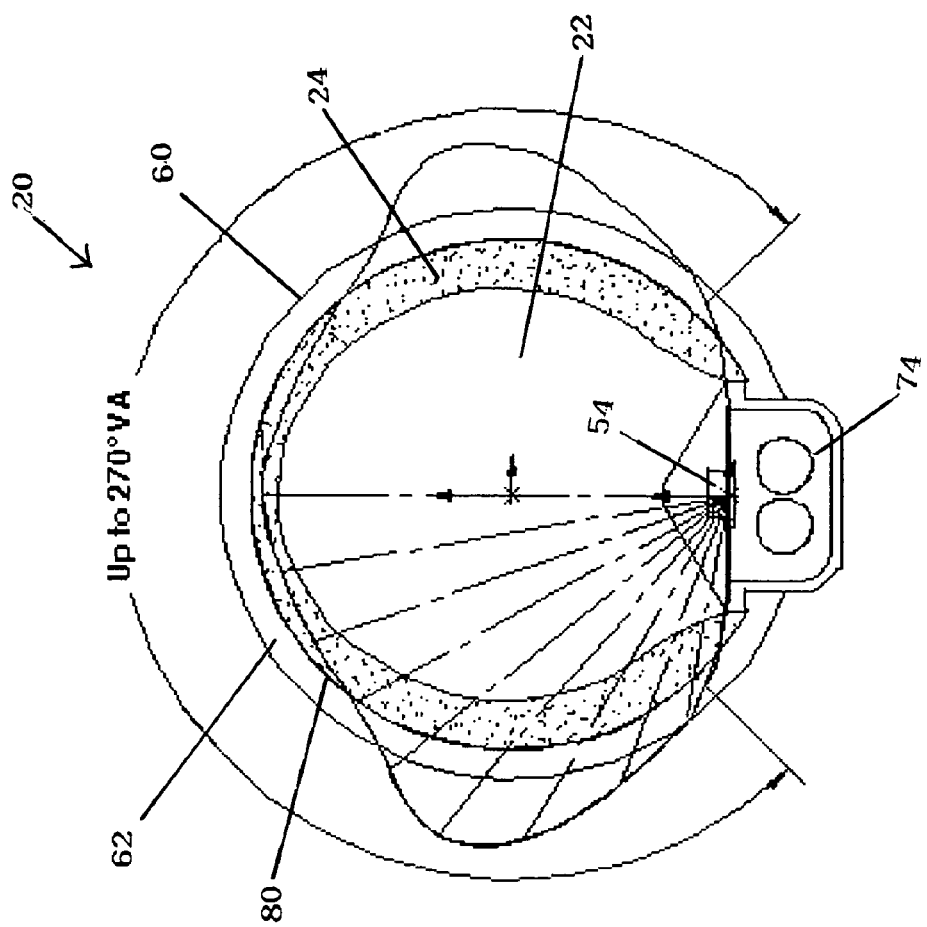
FIG. 2 is a cross section of one embodiment of the present invention.
Figure 3:
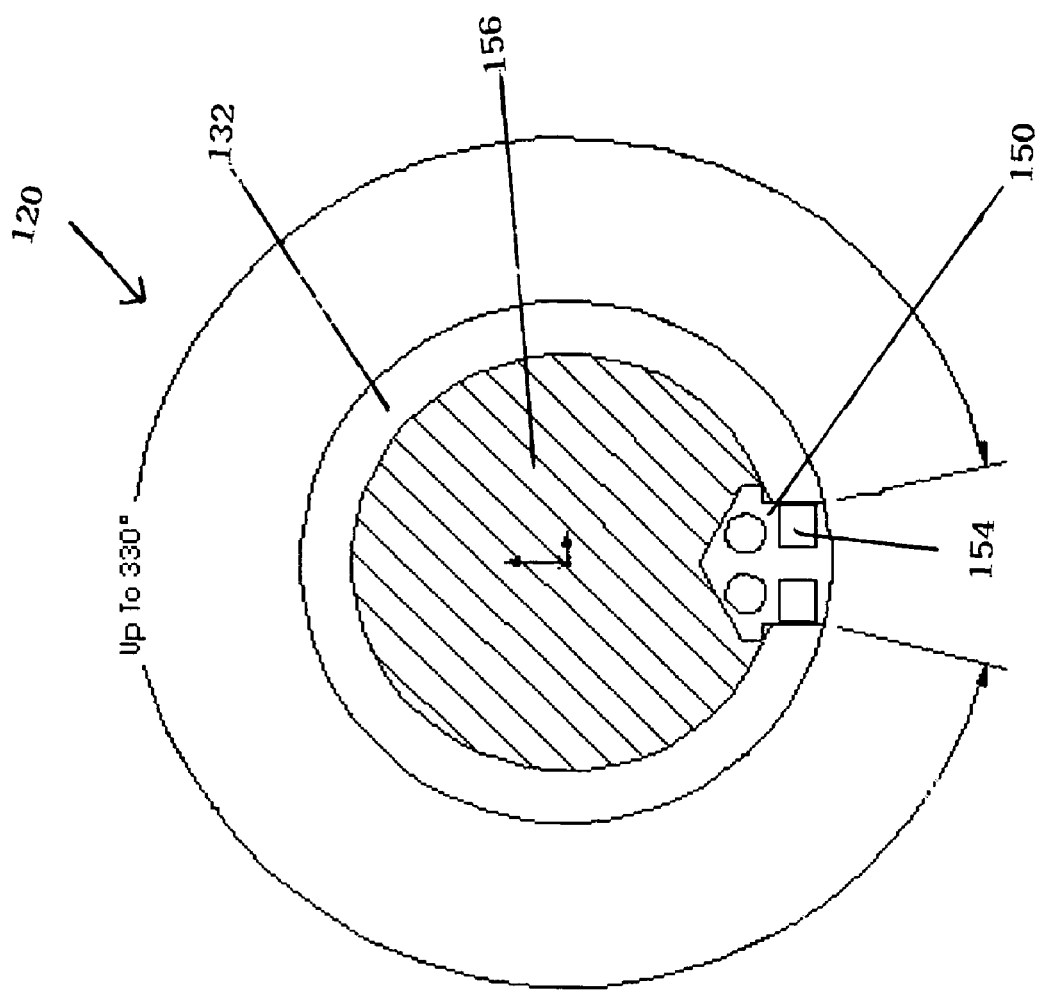
FIG. 3 is a cross section of an alternative embodiment of the present invention.

In a first embodiment of the present invention, the light pipe 20 is a rigid but formable rod 32 having generally circular cross-section. Preferably, rod 32 is comprised of multiple layers of material with different optical properties. The base material 22 is preferably optically clear with good transmission. The base material 22 is preferably extruded. A second layer, preferably comprising a diffusing material 24, covers the base material 22. Second layer 24 is preferably coated on the base material via co-extrusion, over-molding or cast, or other plastic processing means. Diffusing layer 24 can be varied in size, shape, thickness, and surface structure to achieve different desired effects such as viewing angle, uniformity, and intensity. Preferably, there is a layer of optically clear material 62 over the optically diffuse layer.

It is desirable that the layers of materials 22, 24 have similar physical properties. It is preferably that the layers have similar glass transition temperatures. This allows the rod 32 to be shaped via heating without inducing high stresses in dissimilar layers or between layers. It is also preferably that the layers have similar coefficients of thermal expansion. This allows for proper functioning of rod 32 through temperature cycles without losing structural integrity. The layers also preferably have similar indexes of refraction to minimize the loses associated with light traveling from one medium to another.

The effect of diffuse layer 24 immersed on optically clear layer 22 is to simulate the appearance of gas inside a glass tube or the inside surface of a glowing neon tube. Rod 32 could optionally be made entirely of a optically diffuse material to achieve a uniform glow.

Rod 32 preferably has a groove 30 along the entire length. Preferably groove 30 is adapted to retain a flexible LED light engine 50 when LED light engine 50 is inserted in groove 30. The specific shape of the groove can be designed to mate features on flexible LED light engine 50 to provide a frictional-fit or a snap-fit between rod 32 and flexible LED light engine 50. Groove 30 also positions the flexible LED light engine 50 in the proper location and orientation to achieve desirable results with respect to viewing angle, uniformity, and intensity of the illuminated light guide.

Preferably, the light engine is sized similarly to a neon tube.

In a first alternative embodiment, flexible LED light engine 50 is comprised of at least one LED 54 mounted on each of a plurality of circuit boards 64 that are connected via wire jumpers 66. Alternatively, flexible LED light engine 50 comprises at least one LED mounted to a flexible circuit. In another alternative embodiment, flexible LED light engine 50 comprises at least one LED 54 mounted to circuit board and insert into a connector that is attached to a multi-wire bus. In yet another alternative embodiment, flexible LED light engine 50 comprises at least one LED 54 mounted to a leadframe. Preferably, the light engine comprises a plurality of LEDs 54 connected in series/parallel, parallel, or parallel/series by wires 76. In another embodiment, flexible LED light engine 50 is co-extruded into a continuous profile of flexible thermoplastic material 74. It is preferable that the flexible thermoplastic have properties similar to layers 22, 24 of light guide 20.

Optionally, small sections of LED light engine 50 can be overmolded with a low melt temperature, thermoplastic 72 to provide weather resistance. The overmold could provide a retention/locking element to interact with groove 30 in light guide 20. Thermoplastic 72 needs to have a melt temperature low enough to not damage the LEDs. Thermoplastic 72 can be either flexible, ductile, or rigid. Preferably, thermoplastic 72 is clear and has an index of refraction that is similar to that of the epoxy used to mount the LEDs and that of light guide 20 to minimize losses.

Light engine(s) 50 could operate on either a constant current or constant voltage.

In an alternative embodiment, light guide 120 is a back lit light pipe 132 formed around a mandrel 156 that has a generally circular cross section and illuminated along its length via a flexible LED light engine 150 with opposing LEDs 54 at each location or every other location that emit light directed toward the edge of light pipe 132. LEDs 54 are preferably side-emitting LEDs. Forward emitting LEDs that are directed into the edge of light pipe 150 can also be used. Total internal reflection (TIR) is utilized to direct the emitted light through light pipe 132 around the circumference of the generally circular shape and radially outward from light pipe 132 to achieve a uniform light appearance of the light guide around the circumference. This occurs at each LED location along flexible LED light engine 150. Preferably, LEDs 154 are spaced to achieve the desired uniformity along the length of light pipe 150.

In another alternative embodiment, a layer of material that contains one or more phosphor is included in the light guide to achieve custom colors. The phosphor preferably can be excited by either blue or UV LEDs. Preferably, the phosphor is a mono-, bi-, or tri-phosphor blend. Phosphor layer may be created by adding phosphor to the optically diffuse layer of material 24 or be a separate layer 80.

In another embodiment, flexible LED light engine could be comprised of a multi-wire electrical bus with power and signal conductors with LEDs of different or the same color to achieve desired visual effects such as chasing, color changing, or dynamic color control.

In another embodiment, LED light engine could be co-extruded in center of light guide with LEDs facing in opposing directions to achieve a 360° viewing angle.

In another embodiment, multiple LEDs per location aimed in different directions are used to increase viewing angle.

In another embodiment, additional LEDs are aimed in the opposite direction of the light guide to provide back directed light output for a halo effect.

A user such as a sign manufacturer thermoforms the rod 32 into a desired shape using commonly available tools or equipment such as a PVC heating blanket, a heat gun, or a PVC heating box (not shown). This forming can be done either in a factory or at the site of installation. After heating the rod to a specific softening temperature or glass transition temperation, it can be either free formed or placed in a template of the desired shape. Upon cooling the rod will retain the desired shape as well as the original cross-sectional shape and material properties. Flexible LED light engine 50 of the desired color or colors is then inserted into and retained in groove 30 along the length of the formed rod 32. Alternatively, more than one light engine can be used. The system is then mounted and connected to a low voltage power supply via simple electrical connections.

Preferably, the curvilinear LED light source has a viewing angle of 180° or greater. Most preferably, the light has a viewing angle of about 360°.

I claim:

1. A method for simulating neon lighting using a light emitting diode ("LED") device comprising:

thermoforming a rod into a desired shape, the rod including a groove running along a greatest dimension of the rod, the groove being substantially U-shaped in a cross section taken normal to the greatest dimension of the rod, the rod being made from a light transmissive material that is rigid and formable when heated to retain a rigidly formed shape after being cooled, the rod also including light diffusing material for producing light that is similar to neon light; and after cooling of the rod pressing a light engine into the groove of the rod in a direction that is generally perpendicular to the greatest dimension of the rod, the light engine including a plurality of light emitting diodes ("LEDs") overmolded by a flexible material, the light engine being retained by the rod in the groove via a frictional fit or a snap fit between the flexible material of the light engine and the rod.

2. The method of claim 1, wherein the thermoforming step further comprises thermoforming the rod at a site of installation for the device.

3. The device of claim 1, wherein the light engine includes a plurality of LEDs and a plurality of printed circuit boards ("PCBs"), each PCB having at least one LED being mounted thereon and the PCBs being spaced apart from one another and electrically connected to one another.

\* \* \* \* \*